(12) United States Patent
Zrilic

(10) Patent No.: US 9,525,430 B1
(45) Date of Patent: Dec. 20, 2016

(54) METHOD AND APPARATUS FOR FULL-WAVE RECTIFICATION OF DELTA-SIGMA MODULATED SIGNALS

(71) Applicant: Djuro G. Zrilic, Santa Fe, NM (US)

(72) Inventor: Djuro G. Zrilic, Santa Fe, NM (US)

(*) Notice: Subject to any disclaimer, the term of this patent is extended or adjusted under 35 U.S.C. 154(b) by 0 days.

(21) Appl. No.: 14/999,971

(22) Filed: Dec. 3, 2015

(51) Int. Cl.
| | |
|---|---|
| *H03M 3/00* | (2006.01) |
| *G06F 7/52* | (2006.01) |
| *G06G 1/00* | (2006.01) |
| *H03M 1/06* | (2006.01) |

(52) U.S. Cl.
CPC .............. *H03M 3/30* (2013.01); *G06F 7/52* (2013.01); *G06G 1/00* (2013.01); *H03M 1/0626* (2013.01)

(58) Field of Classification Search
None
See application file for complete search history.

(56) References Cited

U.S. PATENT DOCUMENTS

| | | | |
|---|---|---|---|
| 5,349,353 A | 9/1994 | Zrilic | |
| 5,563,916 A * | 10/1996 | Scarpa | H03G 3/3052 375/345 |
| 5,745,063 A * | 4/1998 | Gruber | G01R 21/133 341/131 |
| 6,285,306 B1 | 9/2001 | Zrilic | |
| 6,587,061 B2 | 7/2003 | Petrofsky | |
| 9,141,339 B2 | 9/2015 | Zrilic | |
| 2014/0159929 A1* | 6/2014 | Zrilic | G06F 7/602 341/143 |

OTHER PUBLICATIONS

Y. Hidaka, H. Fujisaka, M. Sakimoto, and M. Morisue, "Piecewise linear operations on Sigma-delta modulated signals", in 2002 9$^{th}$ *International Conference on Electronics, Circuits and Systems*, vol. 3, pp. 983-986.

K. Matsuyama, H. Fujisaka, and T. Kamino, "Arithmetic and piecewise linear circuits for sigma-delta domain multi-level signal processing", in 2005 *International Symposium on Nonlinear Theory and its Applications (NOLTA)*, pp. 58-61, Oct. 2005.

H. Fujisaka, T. Kamio, C. J. Ahn, and K. Haeiwa, "Sorter-based arithmetic circuit for sigma-delta domain signal processing I: Addition, approximate transcendental functions, and log-domain operations", *Circuits and Systems I: Regular Papers, IEEE Transaction on*, vol. 59, No. 9, pp. 1952-1965, Sep. 2012.

H. Fujisaka, M. Sakamoto, C. J. Ahn, T. Kamio, and K. Haeiwa, "Sorter-based arithmetic for sigma-delta domain signal processing II: Multiplication and algebraic functions", *Circuits and Systems I: Regular Papers, IEEE Transaction on*, vol. 59, No. 9, pp. 1966-1979. Sep. 2012.

H. Fujisaka, T. Kamio, C.J. Ahn, H. Haeiwa, "Sequence characteristics of multi-level and second-order sigma-delta modulation signals", *Nonlinear Theory and Applications, IEICE*, vol. 4, No. 3, pp. 313-339, 2013.

* cited by examiner

*Primary Examiner* — Howard Williams

(57) ABSTRACT

The present invention relates to method and apparatus for full-wave rectification of AC delta-sigma modulated signals. It comprises of a delta-sigma modulator, rectifying encoder, and polarity detector. It offers "spike" free rectified signals at the lowest amplitudes of AC signals to be rectified.

1 Claim, 3 Drawing Sheets

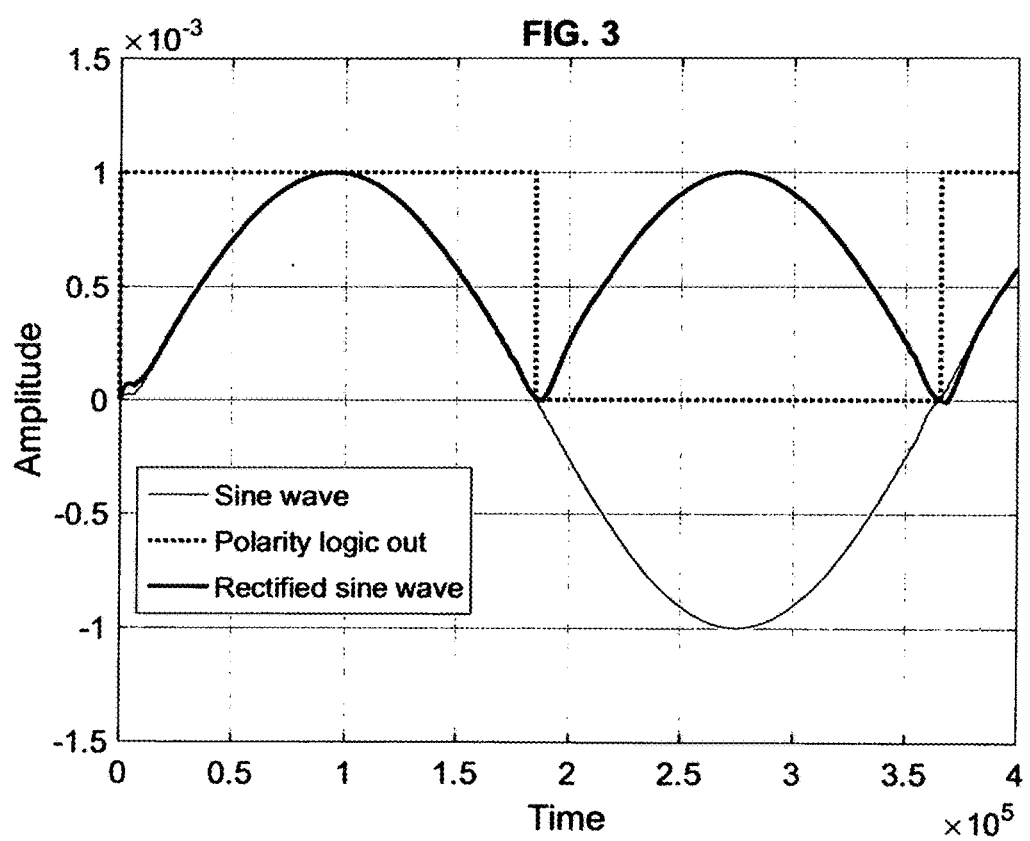

METHOD AND APPARATUS FOR FULL-WAVE RECTIFICATION OF DELTA-SIGMA MODULATED SIGNALS

CROSS REFERENCES TO RELATED APPLICATIONS

Dj. Zrilic, U.S. Pat. No. 5,349,353, Date of patent: Sep. 20, 1994

Dj. Zrilic, U.S. Pat. No. 6,285,306 B1, Date of Patent: Sep. 4, 2001

J. G. Petrofsky, U.S. Pat. No. 6,587,061 B2, Date of Patent: Jul. 1, 2003

Dj. Zrilc, U.S. Pat. No. 9,141,339 B2, Date of Patent: Sep. 22, 2015

STATEMENT REGARDING FEDERALLY SPONSORED R&D

These research results are not sponsored by Government grants.

NAME OF PARTIES TO A JOINT RESEARCH AGREEMENT

Individual project of Dr. Djuro G. Zrilic

BACKGROUND OF INVENTION

1. Field of the Invention

The present invention relates to methods and apparatus for nonlinear processing of a delta-modulated pulse stream. The analog input signal is first converted into a one-bit, high density pulse stream using a delta-sigma modulator ($\Delta$-$\Sigma$M) as an analog-to-digital converter (ADC). $\Delta$-$\Sigma$M is highly oversampled and its pulse stream is nonlinearly processed in the rectifying encoder (RE), than filtered to get an analog rectified input signal. This circuit is known in literature as a full-wave rectifier or absolute circuit. Thus, the field of this invention is a nonlinear processing of one-bit pulse stream and it belongs to the area of non-linear digital signal processing (DSP).

2. Description of the Prior Art

There are few published references dealing with nonlinear processing of $\Delta$-$\Sigma$ modulated pulse stream. A majority of these references come from authors [1], [2], [3], [4], [5]. A simplified solution was proposed by Zrilic. In addition to squaring operations performed on a $\Delta$-$\Sigma$ pulse stream [U.S. Pat. No. 9,141,339 B2], this circuit performs rectification as well when a low pass filter (demodulator) is wide enough. However, existing solutions for $\Delta$-$\Sigma$ based rectification introduce undesired "spikes" at lower amplitude levels of the signal to be rectified. In particular, appearances of "spikes" are critical at zero crossings of an AC signal to be rectified. One possible solution to remove "spikes" was proposed in reference [5]. However, this solution requires a multi-level delta-sigma modulator, complex and power consuming logic for a sign detector circuit and so called "sorting network" needed to interface output of the multi-level $\Delta$-$\Sigma$ modulator [3], [4], [5].

To overcome the problem of "spikes" appearance, we propose a new type of absolute circuit which consists of a D flip-flop, XNOR logic gate, and a simple polarity (sign) logic detector.

BRIEF SUMMARY OF THE INVENTION

This invention introduces a novel, absolute circuit which we name Rectifying Encoder (RE). Operation of this circuit is based on direct, nonlinear processing of a $\Delta$-$\Sigma$ modulated binary pulse stream. The objective of the invention will be apparent upon consideration of the following detailed description, taken in conjunction with the accompanying drawings:

FIG. 1 shows a problem of "spike" appearance in prior art solutions.

FIG. 2 shows a detail circuit schematic of the proposed rectifying encoder (RE) constructed in accordance with the present invention.

FIG. 3 shows corresponding waveforms depicted in FIG. 2.

The objective of this invention is to eliminate the appearance of "spikes" in existing RE solutions.

It is still another objective of the present invention to reduce complexity of the existing solution, and minimize the silicon area of the integrated circuit (IC).

It is still a future objective of the present invention to employ the first order $\Delta$-$\Sigma$M, the second order $\Delta$-$\Sigma$M or any higher order binary $\Delta$-$\Sigma$M as an ADC in the process of rectification of AC signals.

BRIEF DESCRIPTION OF DRAWINGS

FIG. 3 shows demodulated sine wave, rectified sine wave and polarity (sign) logic output.

DETAILED DESCRIPTION OF THE INVENTION

Definition

By definition, a rectifier is an electrical device that converts alternate current (AC) to direct current (DC). The full wave rectifier converts both polarities of the input to a pulsing DC signal. Historically, depending on the state of the technology, there have been many types of rectifiers such are electromechanical, vacuum tube, solid state, etc. Current analog rectifiers consist of a centrally tapped transformer and two diodes, or four diodes in a bridge configuration with a transformer without center tap. Virtually all electronic devices require DC thus, all electronic equipment use rectifiers. Traditionally, a rectifier is used to detect amplitude modulated (AM) signals. However, perspective rectifiers for rectification of light or electromagnetic waves require smaller RE devices with a higher cutoff frequency.

How to Make the Invention

Figure 1:
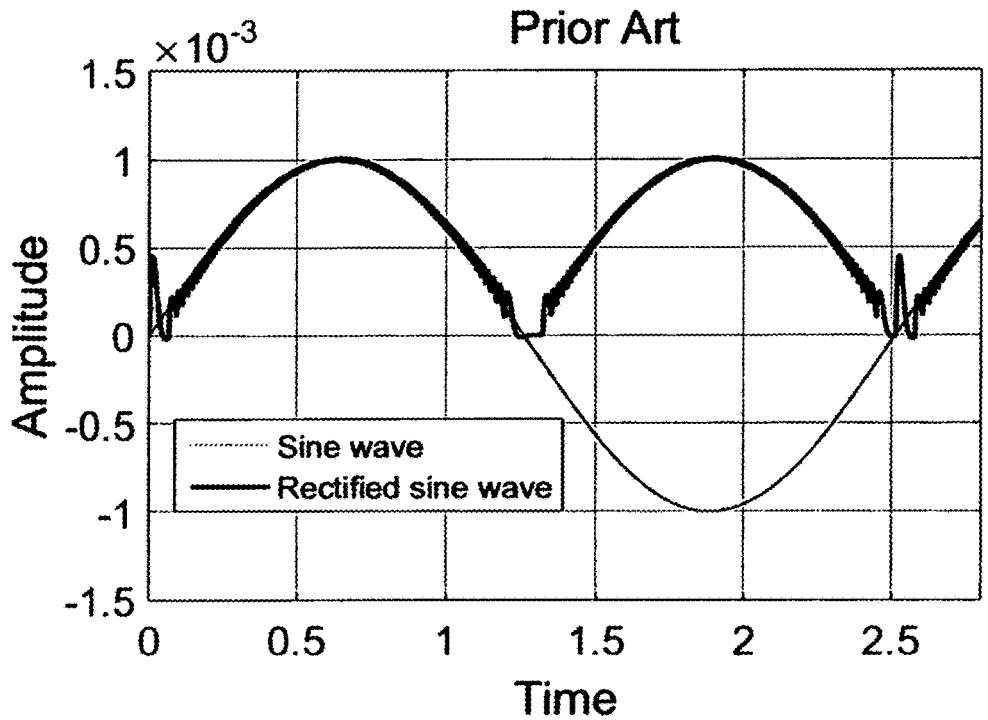
FIG. 1 shows a rectified sinus waveform of prior art solutions [1], [2].
Figure 2:
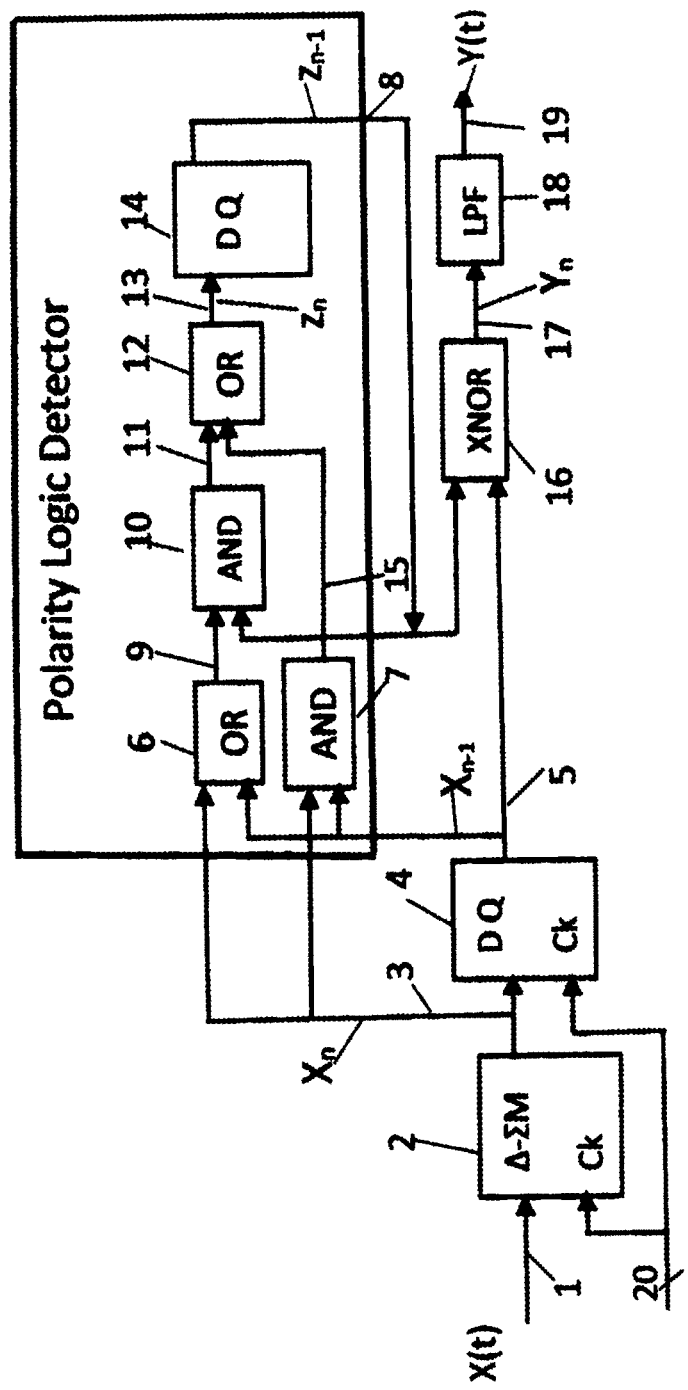
FIG. 2 shows a logic diagram of a rectifying encoder (RE) with a polarity logic detector. It consists of the D-FF with X-OR gate, and polarity detector.

A full embodiment of the circuit of a $\Delta$-$\Sigma$ based RE is shown in FIG. 2. Its operation is as follows:

The analog AC signal x(t) (1) is converted by means of a $\Delta$-$\Sigma$ modulator into a binary pulse stream $X_n$ (3). This signal is fed into the rectifying encoder (RE) and the polarity logic detector, which detects polarity of an AC signal. A rectifying encoder (RE) consists of D flip-flop (4) and XNOR gate (16). Polarity logic detector consists of: OR gates (6) and (12), AND gates (7) and (10), and a D flip-flop (14). Operation of the polarity logic detector, shown in FIG. 2, is described by a Boolean equation $$Z_n = Z_{n-1}(X_n + X_{n-1}) + X_n X_{n-1} \quad (1)$$

Operation of RE is described by a Boolean equation $$Y_n = \text{NOT}[Z_{n-1} \bmod 2X_{n-1}] \quad (2)$$

Validity of the correct operation of the invention is verified through intensive simulations. In FIG. 3, corresponding waveforms are shown for the case when the first order Δ-ΣM is employed as ADC. As an example, the sinusoidal signal of normalized amplitude of 0.001 is to be rectified. It is a Δ-Σ modulated first, and then demodulated for control purposes only (solid line). A binary rectified signal $Y_n$ (17) is a low-pass filtered (LPF), (18), to obtain a rectified analog signal y(t), (19).

This signal is marked by a bolded line. In FIG. 3 an output of polarity (sign) logic is depicted (dashed line), signal $Z_{n-1}$ (8). This signal enables correct detection of a sign of the AC input signal.

How to Use the Invention

Δ-Σ modulation is a well established analog-to-digital conversion (ADC) process. It is low power consuming, high resolution, one-bit conversion process, and it is suitable for VLSI design. It can find applications in low frequency ADC processes such as bio-medical applications, environmental monitoring, seismic, instrumentation, etc. It can find application in audio frequency applications and radio frequency applications as well. Because of its small size, and low power consumption, a Δ-Σ based rectifier can find applications at intermediate radio frequency (IF) stage, where Δ-Σ modulator is frequently employed as ADC. RE can be used in companding circuit such as a compressor and an expander. Frequent application of a rectifier is in an automatic gain control (AGC) and root-mean-square (RMS) circuits. In addition, RE does not require transformers and diodes as analog rectifiers do. RE can be easily implemented in field programmable gate array (FPGA) devices. This IC circuit has only 5 external pins; serial input for acceptance of a Δ-Σ pulse stream, clock input, output, voltage supply and ground pin. Thus, no special manual is needed. This circuit can operate on the first or second order Δ-Σ modulated pulse stream, or higher order Δ-Σ pulse streams as well. Thus, it will be appreciated by those skilled in the art that the present invention is not restricted to the particular preferred embodiments described with reference to the drawings, and that variations can be made therein without departing from the scope of the present invention. The same circuit can operate on a band-pass Δ-Σ pulse stream.

What is claimed is:

1. A "spike" free full wave rectifying or squaring operation circuit, comprising:
    a Δ-Σ modulator for producing a pulse density signal $X_n$;
    a delay element D for delaying the signal $X_n$ one clock pulse;
    a XNOR gate for accepting the signal $X_{n-1}$ and the signal $Z_{n-1}$ of polarity detector;
    a polarity detector logic gates for accepting signals $X_n$ and $X_{n-1}$ to produce signal $Z_{n-1}$; and
    a low-pass filter (LPF) for demodulation (averaging) of a $Y_n$ signal and producing signal y(t), which is the rectified AC input signal x(t).

* * * * *